US008644094B2

(12) United States Patent
Pyo et al.

(10) Patent No.: US 8,644,094 B2
(45) Date of Patent: Feb. 4, 2014

(54) SEMICONDUCTOR MEMORY DEVICES INCLUDING PRECHARGE USING ISOLATED VOLTAGES

(75) Inventors: Suk-Soo Pyo, Hwaseong-si (KR); Hyun Taek Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 13/477,448

(22) Filed: May 22, 2012

(65) Prior Publication Data

US 2012/0300560 A1 Nov. 29, 2012

(30) Foreign Application Priority Data

May 23, 2011 (KR) .................. 10-2011-0048663

(51) Int. Cl.
*G11C 7/06* (2006.01)

(52) U.S. Cl.
USPC ...... 365/189.07; 365/149; 365/154; 365/190; 365/207

(58) Field of Classification Search
None
See application file for complete search history.

(56) References Cited

U.S. PATENT DOCUMENTS

| | | | |
|---|---|---|---|
| 5,689,461 A | 11/1997 | Kaneko et al. | |
| 5,767,737 A | 6/1998 | Liu et al. | |
| 5,781,491 A * | 7/1998 | Lee et al. | 365/227 |
| 5,815,450 A | 9/1998 | Kimura | |
| 5,828,611 A | 10/1998 | Kaneko et al. | |
| 6,069,828 A | 5/2000 | Kaneko et al. | |
| 6,584,030 B2 * | 6/2003 | Marr | 365/226 |
| 6,891,745 B2 * | 5/2005 | Liaw | 365/154 |
| 6,982,915 B2 * | 1/2006 | Houston et al. | 365/211 |
| 7,158,423 B2 * | 1/2007 | Seo | 365/189.09 |
| 7,817,490 B1 * | 10/2010 | Sridhara | 365/227 |
| 7,924,650 B2 * | 4/2011 | Cho et al. | 365/226 |
| 2011/0267875 A1 * | 11/2011 | Kim | 365/163 |

FOREIGN PATENT DOCUMENTS

| | | |
|---|---|---|
| JP | 07-130175 | 5/1995 |
| JP | 08-221996 | 8/1996 |
| KR | 1020070024782 A | 3/2007 |

* cited by examiner

*Primary Examiner* — Tan T. Nguyen
(74) *Attorney, Agent, or Firm* — Myers Bigel Sibley & Sajovec, P.A.

(57) ABSTRACT

A semiconductor memory device includes a memory cell array including a plurality of word lines, a plurality of bit lines including complementary pairs of bit lines, and a plurality of memory cells storing data; a sense amplifier coupled to the memory cell array and configured to sense voltage differences between the complementary pairs of bit lines and amplify the voltage differences; and at least one voltage driver configured to provide either a predetermined voltage or a first power supply voltage to the memory cell array to increase a sensing margin of the semiconductor memory device. The semiconductor memory device increases respective potential differences between complementary pairs of bit lines using a voltage isolated in the memory cell array.

20 Claims, 16 Drawing Sheets

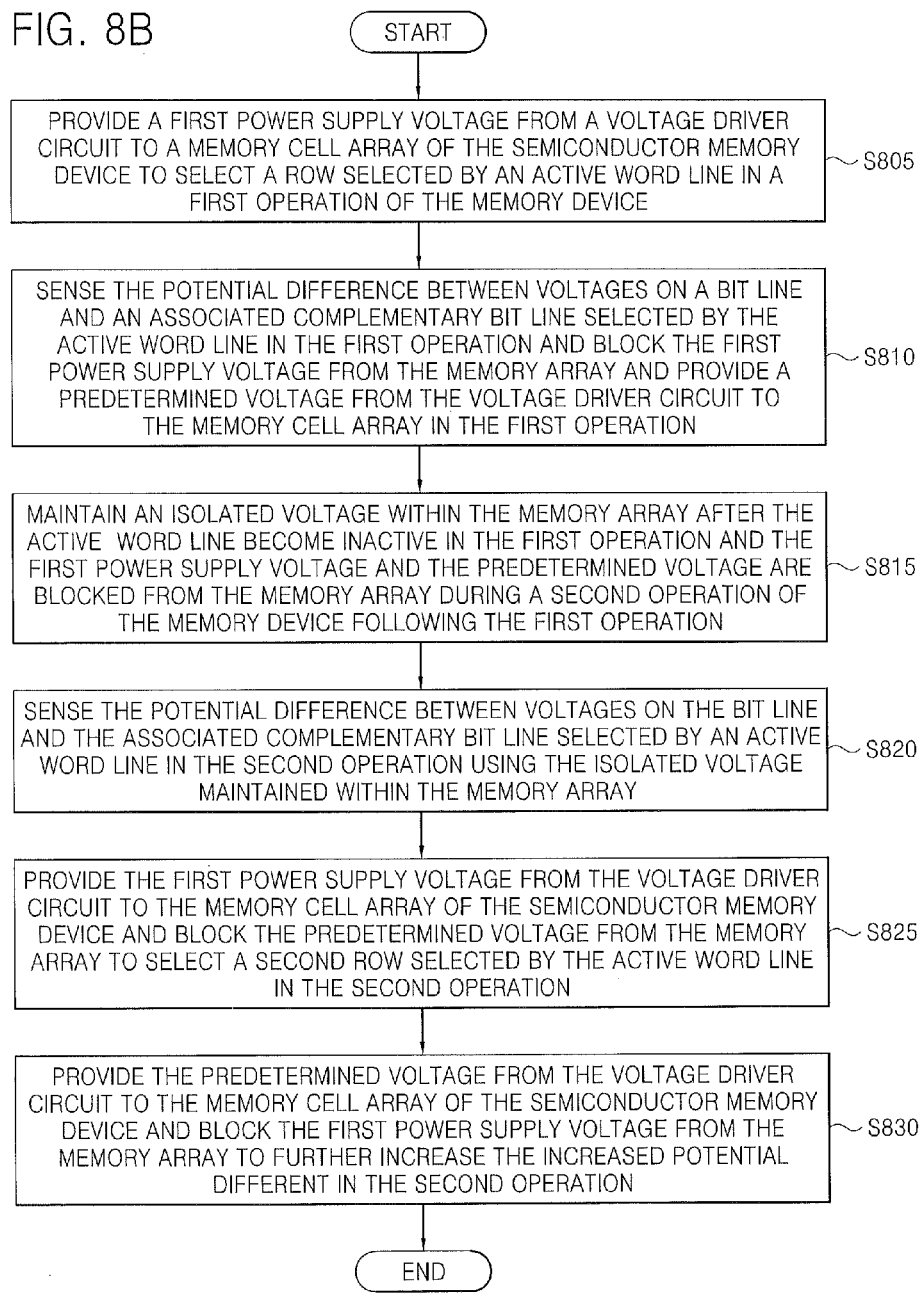

SEMICONDUCTOR MEMORY DEVICES INCLUDING PRECHARGE USING ISOLATED VOLTAGES

CROSS-REFERENCE TO RELATED APPLICATIONS

This application claims priority under 35 U.S.C. §119(a) from Korean Patent Application No. 10-2011-0048663 filed on May 23, 2011, the disclosure of which is hereby incorporated by reference in its entirety.

BACKGROUND

The inventive concept relates to a semiconductor memory device, and more particularly, to a semiconductor memory device for increasing a sensing margin in a precharge operation.

In a memory access of dynamic random access memory (DRAM), a word line is activated based on an active command and a row address, data of a memory cell connected to the word line is applied to a pair of bit lines as a micro voltage difference, and the micro voltage difference is sensed and amplified by a sense amplifier to a level that can be logically distinguished.

SUMMARY

According to some embodiments of the inventive concept, there is provided a semiconductor memory device including a memory cell array including a plurality of word lines, a plurality of bit lines including complementary pairs of bit lines and a plurality of memory cells storing data. A sense amplifier can be coupled to the memory cell array and configured to sense voltage differences between the complementary pairs of bit lines and amplify the voltage differences. At least one voltage driver can be configured to provide either a predetermined voltage or a first power supply voltage to the memory cell array to increase a sensing margin of the semiconductor memory device, where the semiconductor memory device increases respective potential differences between complementary pairs of bit lines using a voltage isolated in the memory cell array.

According to further embodiments of the inventive concept, there is provided a method of operating a semiconductor memory device. The method includes (a) comparing a level of a first power supply voltage with a level of a predetermined voltage provided to a memory cell array to provide a comparison result; (b) providing the first power supply voltage or the predetermined voltage to the memory cell array based on the comparison result so as to increase a sensing margin of the semiconductor memory device; and (c) increasing a potential difference between a bit line and a complementary bit line as sensing is carried out by a sense amplifier. When operations (a) through (c) are repeated, operation (c) may include increasing the potential difference between the bit line and the complementary bit line using a voltage isolated in the memory cell array.

BRIEF DESCRIPTION OF THE DRAWINGS

The above and other features and advantages of the inventive concept will become more apparent by describing in detail exemplary embodiments thereof with reference to the attached drawings in which:

FIG. 8B is a flowchart illustrating methods of operating a semiconductor memory device according to some embodiments of the inventive concept;

DETAILED DESCRIPTION OF THE EMBODIMENTS

Figure 1:
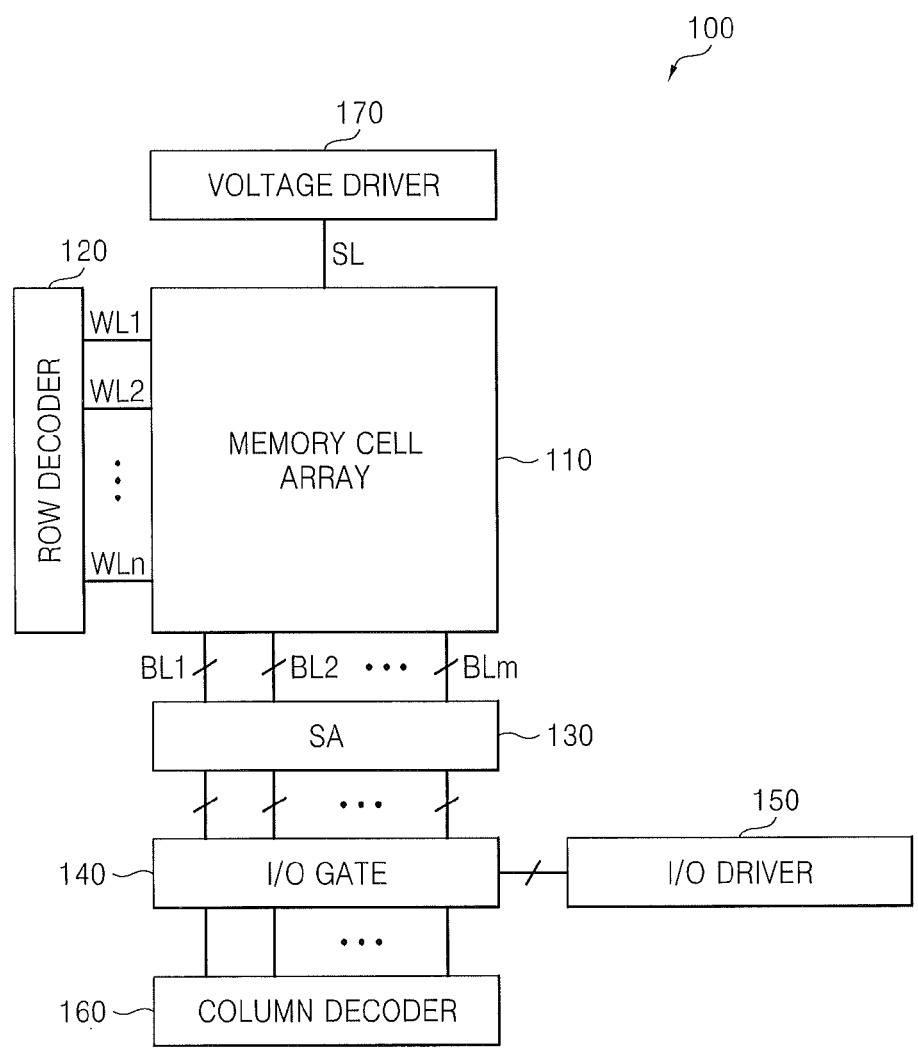
FIG. 1 is a diagram of a semiconductor memory device according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a diagram of a semiconductor memory device 100 according to some embodiments of the inventive concept. Referring to FIG. 1, the semiconductor memory device 100 includes a memory cell array 110, a row decoder 120, a sense amplifier (SA) 130, an input/output (I/O) gate 140, an I/O driver 150, a column decoder 160, and a voltage driver 170.

The memory cell array 110 includes a plurality of word lines WL1 through WLn (where "n" is a natural number), a plurality of bit lines BL1 through BLm (where "m" is a natural number), and a plurality of memory cells storing data. Each of the bit lines BL1 through BLm includes a bit line and a complementary bit line.

The row decoder 120 decodes a row address and selects one of the word lines WL1 through WLn according to a decoding result.

The SA 130 senses and amplifies a voltage difference in each of the bit lines BL1 through BLm and outputs an amplified voltage difference. The column decoder 160 decodes a column address and generates a plurality of column selection signals according to a decoding result. The I/O gate 140 connects the SA 130 with the I/O driver 150 according to the column selection signals output from the column decoder 160.

For instance, during a write operation, the I/O gate 140 transmits write data from the I/O driver 150 to the SA 130 according to the column selection signals output from the column decoder 160. During a read operation, the I/O gate 140 transmits a plurality of signals sensed and amplified by the SA 130 to the I/O driver 150 according to the column selection signals output from the column decoder 160.

When the semiconductor memory device 100 performs the read or the write operation, the SA 130 may receive at least one control signal.

The voltage driver 170 may provide the memory cell array 110 a predetermined voltage. More than one voltage driver 170 may be provided.

Figure 2:
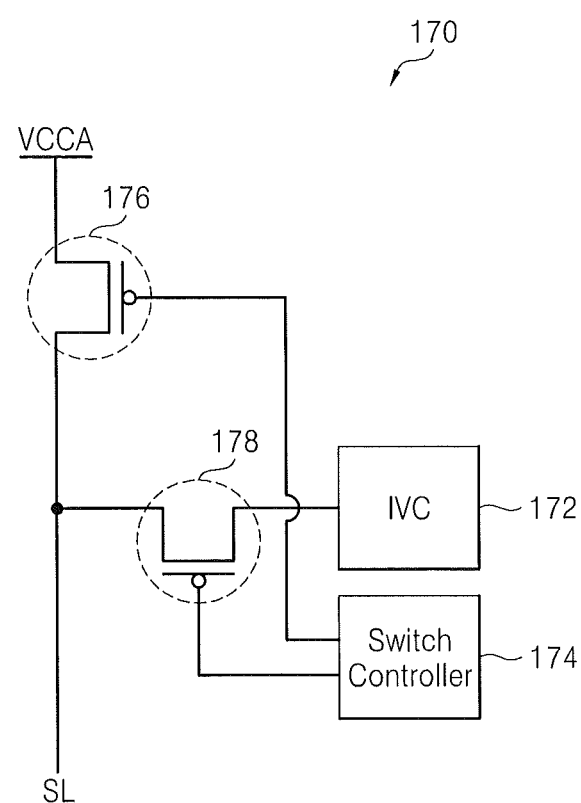
FIG. 2 is a diagram of a voltage driver according to some embodiments of the inventive concept.

FIG. 2 is a diagram of the voltage driver 170 according to some embodiments of the inventive concept. Referring to FIG. 2, the voltage driver 170 includes an internal voltage converter (IVC) 172, a switch controller 174, a first switch 176 and a second switch 178. The first and second switches 176 and 178 may be implemented by P-type metal oxide semiconductor (PMOS) transistors.

The first switch 176 has a first terminal configured to receive a first power supply voltage VCCA, a second terminal connected to a signal line SL connected with the memory cell array 110, and a gate terminal connected to the switch controller 174. The first power supply voltage VCCA may be an external voltage but is not limited thereto.

The second switch 178 has a first terminal connected to the IVC 172, a second terminal connected to the signal line SL connected with the memory cell array 110, and a gate terminal connected to the switch controller 174.

The IVC 172 may apply a predetermined voltage (e.g., 1.3 V) to the memory cell array 110 through the signal line SL when the second switch 178 is turned on.

The switch controller 174 may turn on or off the first switch 176 and the second switch 178. When the switch controller 174 turns on the first switch 176, it may turn off the second switch 178. When the switch controller 174 turns on the second switch 178, it may turn off the first switch 176.

When the first switch 176 is turned on, the first power supply voltage VCCA may be applied to the memory cell array 110. At this time, the level of the first power supply voltage VCCA may be equal to or greater than the level of the predetermined voltage (e.g., 1.3 V).

For instance, when the first switch 176 receives a low signal from the switch controller 174 and the second switch 178 receives a high signal from the switch controller 174, the first switch 176 is turned on and the second switch 178 is turned off. Accordingly, the first power supply voltage VCCA is applied to the memory cell array 110.

When the first switch 176 receives the high signal from the switch controller 174 and the second switch 178 receives the low signal from the switch controller 174, the first switch 176 is turned off and the second switch 178 is turned on. Accordingly, the predetermined voltage (e.g., 1.3 V) generated by the IVC 172 is applied to the memory cell array 110.

Figure 3:
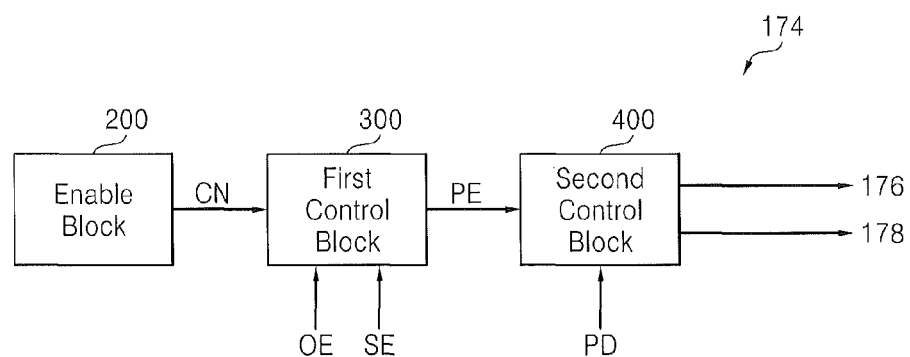
FIG. 3 is a diagram of a switch controller illustrated in FIG. 2 according to some embodiments of the inventive concept.

FIG. 3 is a diagram of the switch controller 174 illustrated in FIG. 2 according to some embodiments of the inventive concept. Referring to FIG. 3, the switch controller 174 includes an enable block 200, a first control block 300 and a second control block 400.

The enable block 200 compares the level of the first power supply voltage VCCA with the level of the predetermined voltage (e.g., 1.3 V) and applies an output signal CN to the first control block 300.

The first control block 300 receives the output signal CN of the enable block 200, an operation enable signal OE indicating whether the semiconductor memory device 100 operates, and a sensing enable signal SE indicating whether the SA 130 senses and outputs a switch enable signal PE to the second control block 400.

The second control block 400 receives the switch enable signal PE and a power down signal PD indicating whether the semiconductor memory device 100 is powered down, and outputs control signals for controlling the first and second switches 176 and 178, respectively.

Figure 4A:
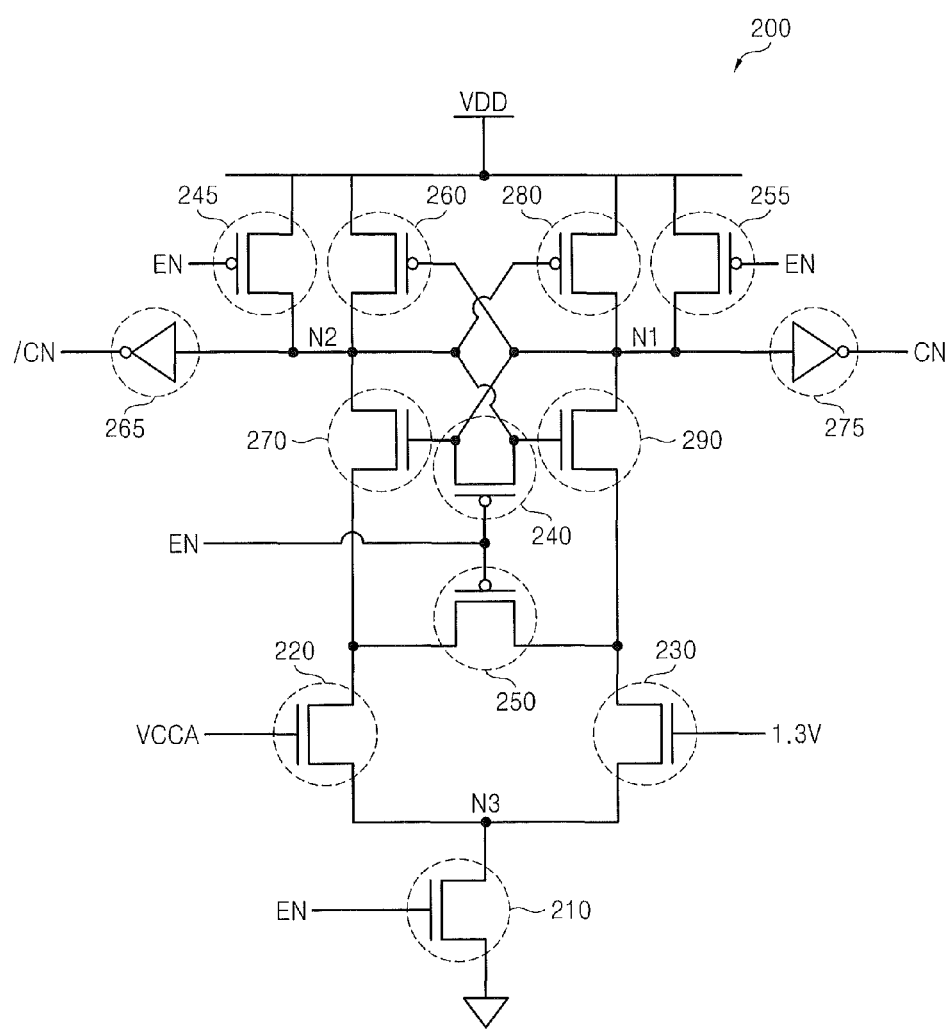
FIG. 4A is a diagram of an enable block illustrated in FIG. 3 according to some embodiments of the inventive concept.

FIG. 4A is a diagram of the enable block 200 illustrated in FIG. 3 according to some embodiments of the inventive concept. Referring to FIG. 4A, the enable block 200 includes a first N-type metal oxide semiconductor (NMOS) transistor 210, a second NMOS transistor 220, a third NMOS transistor 230, a fourth NMOS transistor 270, a fifth NMOS transistor 290, a first PMOS transistor 240, a second PMOS transistor 250, a third PMOS transistor 260, a fourth PMOS transistor 280, a fifth PMOS transistor 245, a sixth PMOS transistor 255, a first inverter 275, and a second inverter 265.

An enable signal EN is applied to a gate terminal of the first NMOS transistor 210, a gate terminal of the first PMOS transistor 240, a gate terminal of the second PMOS transistor 250, a gate terminal of the fifth PMOS transistor 245 and a gate terminal of the sixth PMOS transistor 255.

When the enable signal EN is at a logic high level, the first NMOS transistor 210 is turned on while the first, the second, the fifth and the sixth PMOS transistors 240, 250, 245 and 255 are turned off.

A source terminal of the first NMOS transistor 210 is connected to a ground potential and a drain terminal of the first NMOS transistor 210 is connected to source terminals of the second and the third NMOS transistors 220 and 230.

The first power supply voltage VCCA and the predetermined voltage are respectively applied to gate terminals of the second and the third NMOS transistors 220 and 230.

A gate terminal of the third PMOS transistor 260 and a gate terminal of the fourth NMOS transistor 270 are connected in common to a first node N1. A drain terminal of the third PMOS transistor 260 and a drain terminal of the fourth NMOS transistor 270 are connected in common to a second node N2. A source terminal of the fourth NMOS transistor 270 is connected with a drain terminal of the second NMOS transistor 220. A source terminal of the third PMOS transistor 260 is connected to a second power supply voltage VDD.

A gate terminal of the fourth PMOS transistor 280 and a gate terminal of the fifth NMOS transistor 290 are connected in common to the second node N2. A drain terminal of the fourth PMOS transistor 280 and a drain terminal of the fifth NMOS transistor 290 are connected in common to the first node N1. A source terminal of the fifth NMOS transistor 290 is connected with a drain terminal of the third NMOS transistor 230. A source terminal of the fourth PMOS transistor 280 is connected to the second power supply voltage VDD. At this time, the level of the second power supply voltage VDD may be the same as or different from the level of the first power supply voltage VCCA.

The first inverter 275 has an input terminal connected to the first node N1 and outputs the output signal CN resulting from inverting a signal of the first node N1. The second inverter 265 has an input terminal connected to the second node N2 and outputs an output signal /CN resulting from inverting a signal of the second node N2.

Since the gate terminal of the fourth PMOS transistor 280 and the gate terminal of the fifth NMOS transistor 290 are connected in common, when the fifth NMOS transistor 290 is turned on, the fourth PMOS transistor 280 is turned off; and when the fifth NMOS transistor 290 is turned off, the fourth PMOS transistor 280 is turned on.

When the fourth PMOS transistor 280 is turned on and the fifth NMOS transistor 290 is turned off, the first node N1 is at a logic high level; the third PMOS transistor 260 is turned off; and the fourth NMOS transistor 270 is turned on. Accordingly, the second node N2 is at a logic low level. Consequently, the first node N1 and the second node N2 are at opposite logic levels to each other.

A drain terminal of the fifth PMOS transistor 245 is connected to the second node N2 and a source terminal of the fifth PMOS transistor 245 is connected to the second power supply voltage VDD.

A drain terminal of the sixth PMOS transistor 255 is connected to the first node N1 and a source terminal of the sixth PMOS transistor 255 is connected to the second power supply voltage VDD.

When the enable signal EN is applied to the gate terminal of the fifth PMOS transistor 245 and the gate terminal of the sixth PMOS transistor 255 and the enable signal EN is at the logic high level, the fifth and the sixth PMOS transistors 245 and 255 are turned off.

When the enable signal EN is at a logic low level, the fifth and the sixth PMOS transistors 245 and 255 are turned on and the first and the second nodes N1 and N2 are at the logic high level.

When the enable signal EN is applied to the gate terminal of the first PMOS transistor 240 and the gate terminal of the second PMOS transistor 250 and the enable signal EN is at the logic high level, the first and the second PMOS transistors 240 and 250 are turned off.

When the enable signal EN is at the logic low level, the first and the second PMOS transistors 240 and 250 are turned on. As a result, the drain terminals of the second and the third NMOS transistors 220 and 230 are short-circuited and the gate terminals of the fourth and the fifth NMOS transistors 270 and 290 are also short-circuited.

The enable block 200 receives the first power supply voltage VCCA and the predetermined voltage (e.g., 1.3 V) and outputs the output signal at different logic levels according to which one between the level of the first power supply voltage VCCA and the level of the predetermined voltage (e.g., 1.3 V) is greater. For instance, when the level of the first power supply voltage VCCA is greater than the level of the predetermined voltage (e.g., 1.3 V), a current flowing to a third node N3 through the drain and the source terminals of the second NMOS transistor 220 is greater than a current flowing to the third node N3 through the drain and the source terminals of the third NMOS transistor 230.

As a result, a voltage at the drain terminal of the second NMOS transistor 220 decreases while a voltage at the drain terminal of the third NMOS transistor 230 increases. When the fifth NMOS transistor 290 is turned on, the first node N1 is at the logic high level. At this time, the output signal CN output through the first inverter 275 is at a logic low level.

Figure 4B:
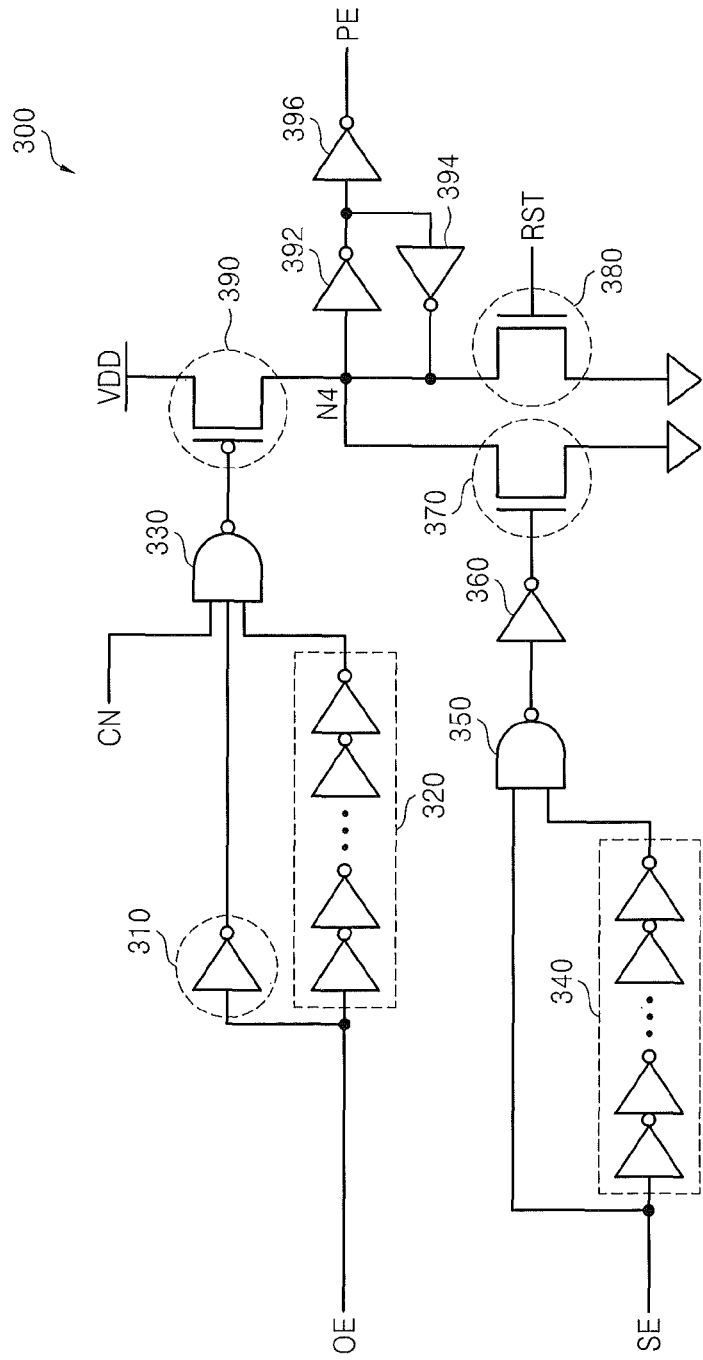
FIG. 4B is a diagram of a first control block illustrated in FIG. 3 according to some embodiments of the inventive concept.
Figure 4C:
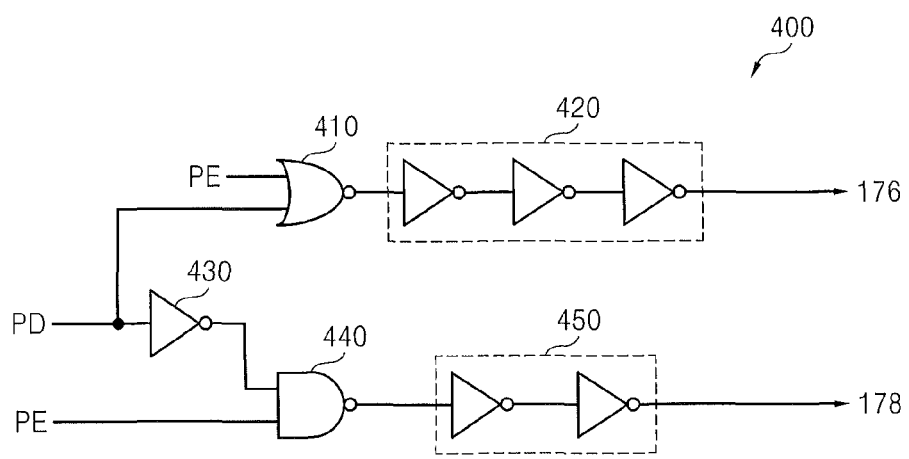
FIG. 4C is a diagram of a second control block illustrated in FIG. 3 according to some embodiments of the inventive concept.

FIG. 4B is a diagram of the first control block 300 illustrated in FIG. 3 according to some embodiments of the inventive concept. FIG. 4C is a diagram of the second control block 400 illustrated in FIG. 3 according to some embodiments of the inventive concept.

Referring to FIG. 4B, the first control block 300 includes a third inverter 310, a first inverter group 320, a first NAND gate 330, a second inverter group 340, a second NAND gate 350, a fourth inverter 360, a sixth NMOS transistor 370, a seventh NMOS transistor 380, a seventh PMOS transistor 390, a fifth inverter 392, a sixth inverter 394, and a seventh inverter 396.

An output terminal of the first NAND gate 330 is connected to a gate terminal of the seventh PMOS transistor 390. An input terminal of the first NAND gate 330 receives the output signal CN of the enable block 200, a signal output from the third inverter 310 inverting the operation enable signal OE and a signal output from the first inverter group 320 inverting the operation enable signal OE.

The first NAND gate 330 outputs a signal at a logic low level only when all of the three input signals are at a logic high level, thereby turning on the seventh PMOS transistor 390.

A source terminal of the seventh PMOS transistor 390 is connected to the second power supply voltage VDD. A drain terminal of the seventh PMOS transistor 390 is connected to a drain terminal of the sixth NMOS transistor 370, a drain terminal of the seventh NMOS transistor 380, an input terminal of the fifth inverter 392 and an output terminal of the sixth inverter 394.

A source terminal of the sixth NMOS transistor 370 is connected to a ground voltage.

The second NAND gate 350 receives the sensing enable signal SE and a signal output from the second inverter group 340 inverting the sensing enable signal SE. The fourth inverter 360 inverts an output signal of the second NAND gate 350.

A gate terminal of the sixth NMOS transistor 370 receives an output signal of the fourth inverter 360. A source terminal of the seventh NMOS transistor 380 is connected to the ground voltage and a gate terminal of the seventh NMOS transistor 380 receives a reset signal RST for the first control block 300.

When the level of the first power supply voltage VCCA is greater than the level of the predetermined voltage (e.g., 1.3 V), the output signal CN of the enable block 200 is at the logic low level, as described above. Since the output signal CN of the enable block 200 is at the logic low level, the first NAND gate 330 outputs a signal at a logic high level regardless of the operation enable signal OE. At this time, the seventh PMOS transistor 390 is turned off.

When the sensing enable signal SE is at a logic high level since the SA 130 performs sensing, the second NAND gate 350 may output a signal at a logic low level based on a logic level of a signal output from the second inverter group 340 inverting the sensing enable signal SE. At this time, the signal output from the second inverter group 340 may be at a logic high level.

The logic low signal output from the second NAND gate 350 is inverted by the fourth inverter 360. A logic high signal output from the fourth inverter 360 turns on the sixth NMOS transistor 370, makes a fourth node N4 at a logic low level, and passes through the fifth inverter 392 and the seventh inverter 396. As a result, an output signal PE at a logic low level is generated.

When the level of the predetermined voltage (e.g., 1.3 V) is greater than the level of the first power supply voltage VCCA, the output signal CN of the enable block 200 is at the logic high level.

When the operation enable signal OE is at a logic low level, a signal obtained by inverting the operation enable signal OE using the third inverter 310 and a signal obtained by inverting the operation enable signal OE using the first inverter group 320 are input to the first NAND gate 330.

Since the output signal CN of the enable block 200 is at the logic high level and the signal obtained by inverting the operation enable signal OE using the third inverter 310 is at a logic high level, the first NAND gate 330 may output a logic low signal based on the logic level of the signal obtained by inverting the operation enable signal OE using the first inverter group 320, thereby turning on the seventh PMOS transistor 390. At this time, the signal output from the first inverter group 320 may be at a logic high level.

As a result, a signal of the fourth node N4 is at a logic high level and passes the fifth inverter 392 and the seventh inverter 396, and therefore, the output signal PE at a logic high level is generated.

Referring to FIG. 4C, the second control block 400 includes a first NOR gate 410, a third inverter group 420, an eighth inverter 430, a third NAND gate 440 and a fourth inverter group 450. The first NOR gate 410 receives the output signal PE of the first control block 300 and the power down signal PD.

For instance, when the power down signal PD is at a logic low level and the output signal PE of the first control block 300 is at the logic low level, the first NOR gate 410 outputs a logic high signal. The output signal of the first NOR gate 410 is inverted by the third inverter group 420 and then output to the first switch 176. At this time, the third inverter group 420 includes three inverters, and therefore, the signal output to the first switch 176 is at a logic low level and the first switch 176 is turned on.

In addition, when the power down signal PD is at a logic low level and the output signal PE of the first control block 300 is at the logic low level, the third NAND gate 440 that receives the output signal PE of the first control block 300 and a signal generated by inverting the power down signal PD outputs a logic high signal. The output signal of the third NAND gate 440 is inverted by the fourth inverter group 450 and then output to the second switch 178. At this time, the fourth inverter group 450 includes two inverters, and therefore, the signal output to the second switch 178 is at a logic high level and the second switch 178 is turned off.

As a result, the first power supply voltage VCCA is applied to the memory cell array 110.

When the output signal PE of the first control block 300 is at the logic high level, the first NOR gate 410 outputs a logic low signal. The output signal of the first NOR gate 410 is inverted by the third inverter group 420 and then output to the first switch 176. At this time, the third inverter group 420 includes three inverters, and therefore, the signal output to the first switch 176 is at a logic high level and the first switch 176 is turned off.

In addition, when the power down signal PD is at the logic low level and the output signal PE of the first control block 300 is at the logic high level, the third NAND gate 440 that receives the output signal PE of the first control block 300 and a signal generated by inverting the power down signal PD outputs a logic low signal. The output signal of the third NAND gate 440 is inverted by the fourth inverter group 450 and then output to the second switch 178. At this time, the fourth inverter group 450 includes two inverters, and therefore, the signal output to the second switch 178 is at a logic low level and the second switch 178 is turned on.

As a result, the predetermined voltage (e.g., 1.3 V) is applied to the memory cell array 110.

Figure 5:
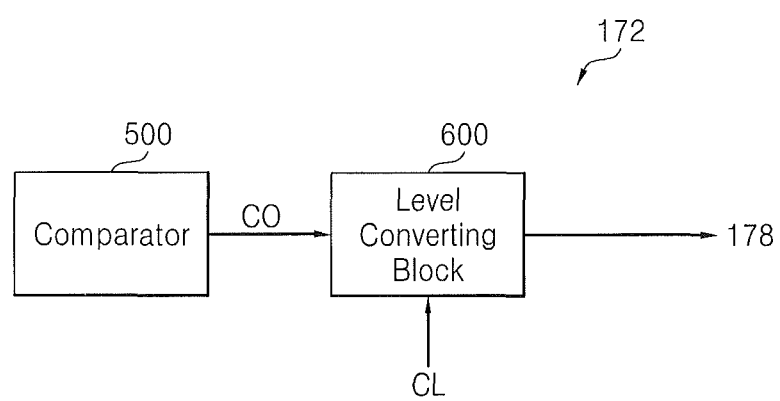
FIG. 5 is a diagram of an internal voltage converter illustrated in FIG. 2 according to some embodiments of the inventive concept.

FIG. 5 is a diagram of the IVC 172 illustrated in FIG. 2 according to some embodiments of the inventive concept. Referring to FIG. 5, the IVC 172 includes a comparator 500 and a level converting block 600.

The comparator 500 compares the level of the first power supply voltage VCCA with a reference voltage level and generates an output signal CO to the level converting block 600. At this time, the reference voltage level may be the level of a voltage that the voltage driver 170 provides the memory cell array 110 but is not restricted thereto.

The level converting block 600 may control a level of a supply voltage of the IVC 172 using the output signal CO as an enable signal.

Figure 6A:
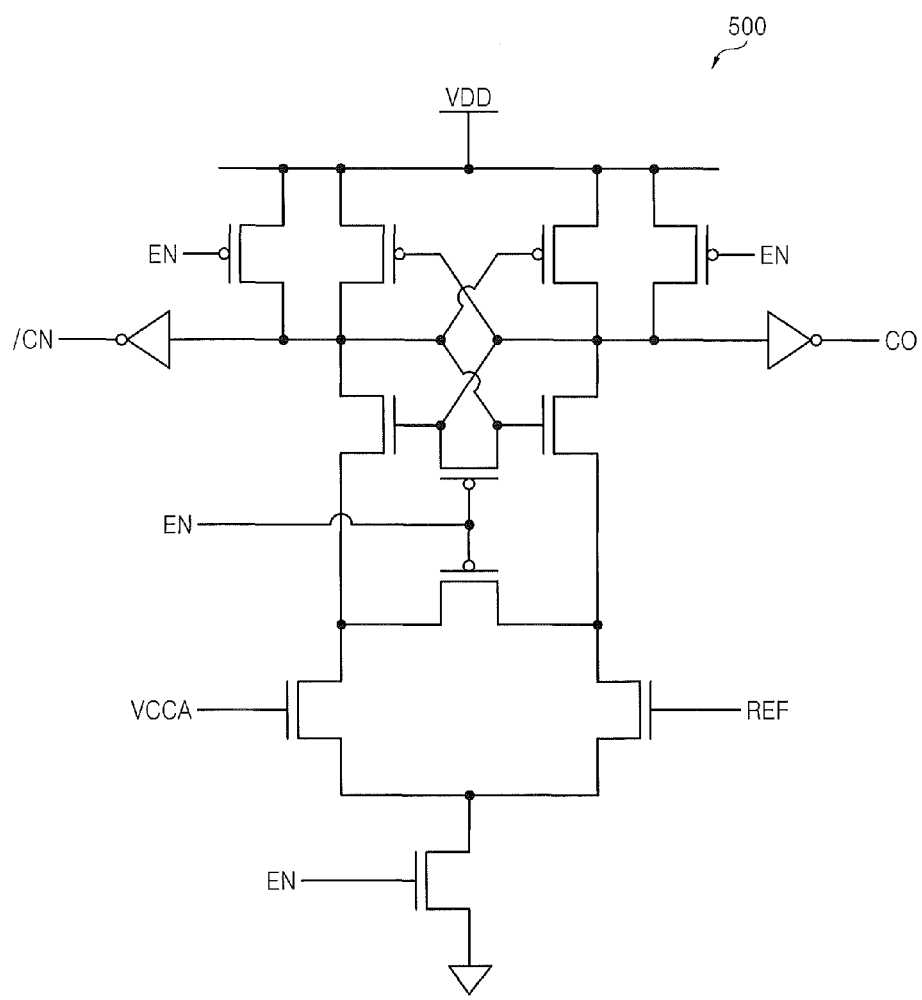
FIG. 6A is a diagram of a comparator illustrated in FIG. 5 according to some embodiments of the inventive concept.
Figure 6B:
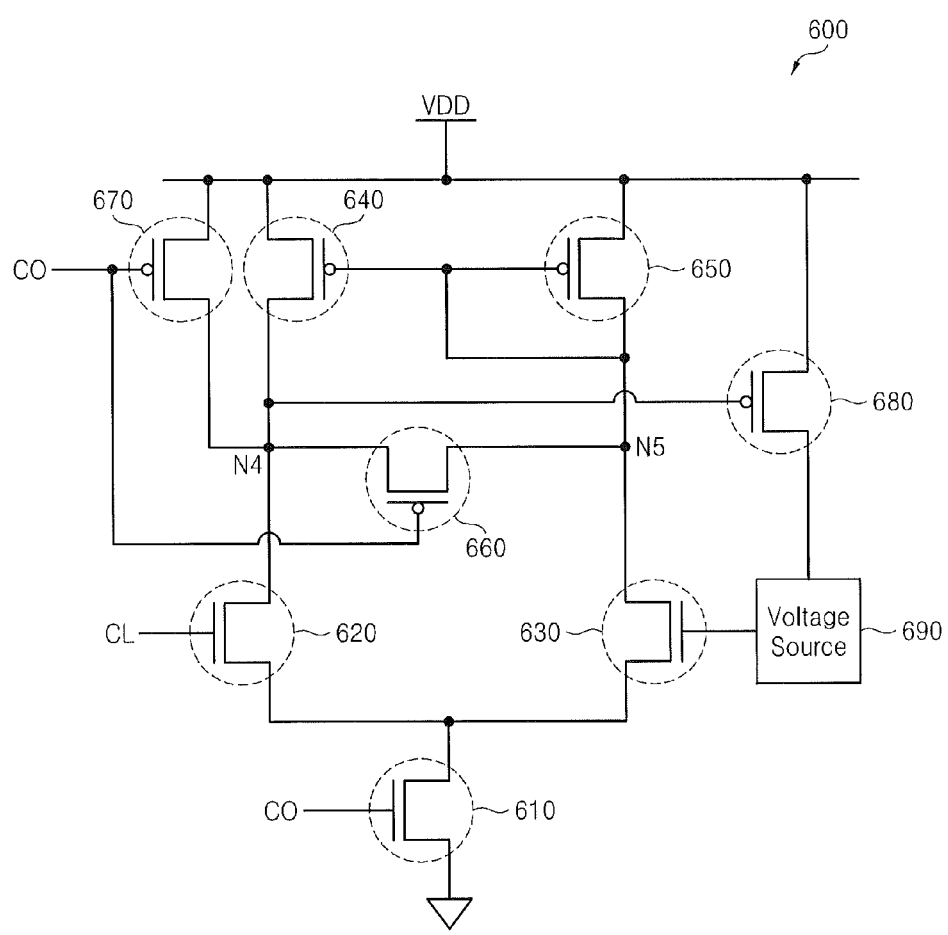
FIG. 6B is a diagram of a level converting block illustrated in FIG. 5 according to some embodiments of the inventive concept.

FIG. 6A is a diagram of the comparator 500 illustrated in FIG. 5 according to some embodiments of the inventive concept. FIG. 6B is a diagram of the level converting block 600 illustrated in FIG. 5 according to some embodiments of the inventive concept.

The comparator 500 illustrated in FIG. 6A is the same as the enable block 200 illustrated in FIG. 4A. Thus, a detailed description of the operations of the comparator 500 will be omitted.

The first power supply voltage VCCA and the predetermined voltage (e.g., 1.3 V) are applied to the enable block 200 in FIG. 4A, but the first power supply voltage VCCA and a reference voltage REF are applied to the comparator 500 in FIG. 6A.

Accordingly, the level of the first power supply voltage VCCA is greater than the level of the reference voltage REF, the output signal CO of the comparator 500 is at a logic low level. When the level of the reference voltage REF is greater than the level of the first power supply voltage VCCA, the output signal CO of the comparator 500 is at a logic high level.

Referring to FIG. 6B, the level converting block 600 includes an eighth NMOS transistor 610, a ninth NMOS transistor 620, a tenth NMOS transistor 630, an eighth PMOS transistor 640, a ninth PMOS transistor 650, a tenth PMOS transistor 660, an eleventh PMOS transistor 670, a twelfth PMOS transistor 680 and a voltage source 690.

A source terminal of the eighth NMOS transistor 610 is connected to the ground voltage and a drain terminal of the eighth NMOS transistor 610 is connected to a source terminal of the ninth NMOS transistor 620 and a source terminal of the tenth NMOS transistor 630.

A control voltage CL is applied to a gate terminal of the ninth NMOS transistor 620 and a voltage from the voltage source 690 is applied to a gate of the tenth NMOS transistor 630. Here, the control voltage CL may be used to adjust a supply voltage of the voltage source 690.

A gate terminal of the eighth NMOS transistor 610 receives the output signal CO of the comparator 500. A source terminal of the eighth PMOS transistor 640 and a source terminal of the ninth PMOS transistor 650 are connected to the second power supply voltage VDD. A drain terminal of the eighth PMOS transistor 640 is connected to a drain terminal of the ninth NMOS transistor 620. A drain terminal of the ninth PMOS transistor 650 is connected to a drain terminal of the tenth NMOS transistor 630.

A gate terminal of the eighth PMOS transistor 640 and a gate terminal of the ninth PMOS transistor 650 are connected in common to each other. The gate terminal and the drain terminal of the ninth PMOS transistor 650 are connected in common to each other.

The tenth PMOS transistor 660 is connected between the drain terminal of the eighth PMOS transistor 640 and the drain terminal of the ninth PMOS transistor 650. A gate terminal of the tenth PMOS transistor 660 receives the output signal CO of the comparator 500.

A source terminal of the eleventh PMOS transistor 670 is connected to the second power supply voltage VDD and a drain terminal of the eleventh PMOS transistor 670 is connected to the drain terminal of the eighth PMOS transistor 640. A source terminal of the twelfth PMOS transistor 680 is connected to the second power supply voltage VDD. A gate terminal of the twelfth PMOS transistor 680 is connected to the drain terminal of the eighth PMOS transistor 640. A drain terminal of the twelfth PMOS transistor 680 is connected to the voltage source 690.

When the output signal CO of the comparator 500 is at a logic high level, the eighth NMOS transistor 610 is turned on and the tenth and the eleventh PMOS transistors 660 and 670 are turned off.

For instance, when the control voltage CL is greater than the supply voltage of the voltage source 690, a voltage at a fourth node N4 decreases to a logic low level, and therefore, the twelfth PMOS transistor 680 is turned on. As a result, the second power supply voltage VDD is provided to the voltage source 690, thereby increasing the magnitude of the supply voltage of the voltage source 690.

When the supply voltage of the voltage source 690 is greater than the control voltage CL, a voltage at a fifth node N5 decreases to a logic low level, and therefore, the eighth and the ninth PMOS transistors 640 and 650 are turned on. As a result, the second power supply voltage VDD is applied to the fourth node N4, so that the voltage at the fourth node N4 is at a logic high level and the twelfth PMOS transistor 680 is turned off. Accordingly, the control voltage CL is set so that the supply voltage of the voltage source 690 is adjusted.

Figure 7:
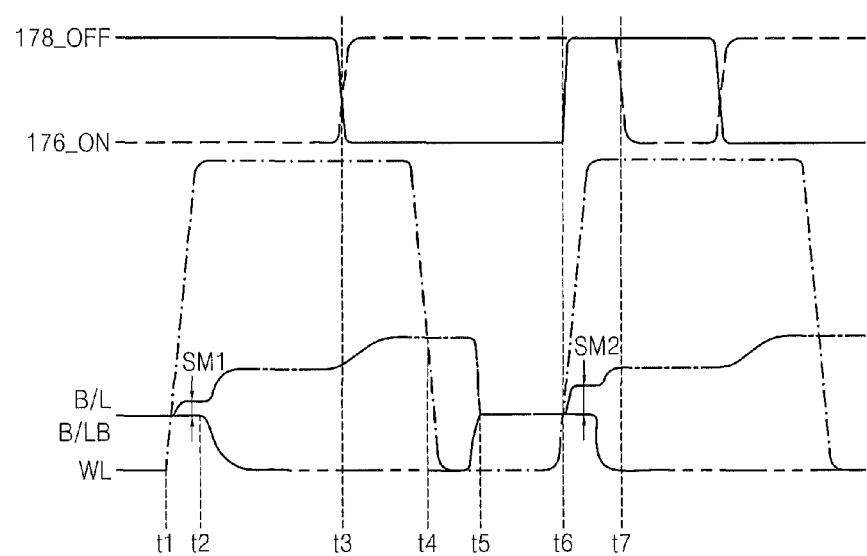
FIG. 7 is a timing diagram illustrating the operations of the semiconductor memory device illustrated in FIG. 1.

FIG. 7 is a timing diagram illustrating the operations of the semiconductor memory device 100 illustrated in FIG. 1. Referring to FIGS. 2 and 7, at a time point t1, a word line WL is turned on and a charge in a capacitor is released, increasing a potential of a bit line B/L. As a result a first sensing margin SM1 is created.

At a time point t2, sensing of the SA 130 is carried out according to an external voltage (e.g., the first power supply voltage VCCA shown in FIG. 2) and a potential difference between the bit line B/L and a complementary bit lint B/LB increases.

At a time point t3, the first switch 176 is turned off and the second switch 178 is turned on, and therefore, a voltage is provided from the voltage driver 170 to the memory cell array 110. As a result, a potential of the bit line B/L increases.

At a time point t4, the word line WL is turned off, the capacitor is recharged, and the operation of the SA 130 stops.

At a time point t5, the operation of the semiconductor memory device 100 is completed.

At a time point t6, the first and the second switches 176 and 178 are turned off and voltage supply to the memory cell array 110 is interrupted. Thereafter, the word line WL is turned on and a charge is released from the capacitor, which increases the potential of the bit line B/L, thereby creating a second sensing margin SM2. Since the first and the second switches 176 and 178 are in an off state, sensing of the SA 130 is carried out using a voltage isolated in the memory cell array 110 through the previous procedure (from the time point t1 to the time point t5), and therefore, the potential difference between the bit line B/L and the complementary bit lint B/LB increases. At this time, the second sensing margin SM2 is greater than the first sensing margin SM1, and therefore, sensing time and data fail decreases. Accordingly, power leveled up through the previous procedure is used, thereby reducing power consumption.

At a time point t7, the first switch 176 is turned on. An operation performed after the time point t7 is the same as that performed after the time point t3.

Figure 8A:
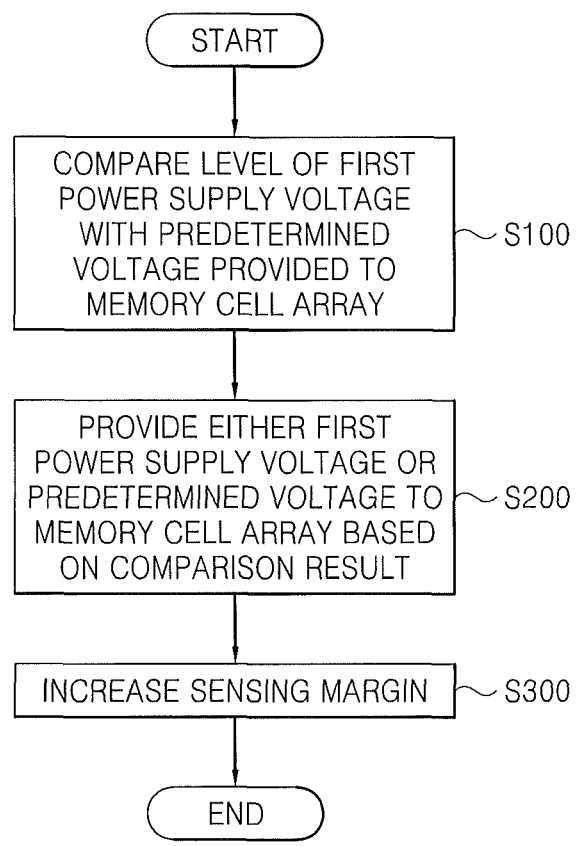
FIG. 8A is a flowchart illustrating methods of operating a semiconductor memory device according to some embodiments of the inventive concept.

FIG. 8A is a flowchart illustrating methods of operating a semiconductor memory device according to some embodiments of the inventive concept. The method illustrated in FIG. 8A may be performed by the semiconductor memory device 100 illustrated in FIG. 1.

Referring to FIG. 8A, the semiconductor memory device 100 compares the level of a first power supply voltage with the level of a predetermined voltage applied to the memory cell array 110 in operation S100.

Thereafter, the semiconductor memory device 100 provides either the first power supply voltage or the predetermined voltage to the memory cell array 110 based on a comparison result in operation 5200. At this time, the semiconductor memory device 100 may provide the first power supply voltage to the memory cell array 110 when the level of the first power supply voltage is greater than the level of the predetermined voltage and may provide the predetermined voltage to the memory cell array 110 when the level of the predetermined voltage is greater than the level of the first power supply voltage.

Next, the semiconductor memory device 100 increases a sensing margin by providing the first power supply voltage or the predetermined voltage in operation 5300. In addition, the semiconductor memory device 100 may adjust the level of the predetermined voltage using the level of a reference voltage and provide the adjusted voltage to the memory cell array 110.

FIG. 8B is a flowchart illustrating methods of operating a semiconductor memory device according to some embodiments of the inventive concept. According to FIG. 8B, a method of operating a semiconductor memory device can be provided by providing a first power supply voltage from a voltage driver circuit to a memory cell array of the semiconductor memory device to select a row selected by an active word line in a first operation of the memory device (S805).

The potential difference between voltages on a bit line and an associated complementary bit line selected by the active word line in the first operation is sensed and the first power supply voltage is blocked from the memory array and a predetermined voltage is provided from the voltage driver circuit to the memory cell array in the first operation (S810).

An isolated voltage is maintained within the memory array after the active word line become inactive in the first operation and the first power supply voltage and the predetermined voltage are blocked from the memory array during a second operation of the memory device following the first operation (S815). The potential difference is sensed between voltages on the bit line and the associated complementary bit line selected by an active word line in the second operation using the isolated voltage maintained within the memory array (S820).

In some embodiments according to the inventive concept, the sensing of the potential difference between voltages on the bit line and the associated complementary bit line selected by an active word line in the second operation using the isolated voltage maintained within the memory array can be provided by increasing the potential difference between the voltages on the bit line and the associated complementary bit line during sensing compared to the potential difference during the first operation to provide an increased potential difference.

Referring the FIG. 8B, the first power supply voltage is provided from the voltage driver circuit to the memory cell array of the semiconductor memory device and the predetermined voltage is blocked from the memory array to select a second row selected by the active word line in the second operation (S825).

In some embodiments according to the inventive concept, the first power supply voltage can be provided from the voltage driver circuit to the memory cell array of the semiconductor memory device and blocking the predetermined voltage from the memory array by increasing the increased potential difference during the second operation responsive to providing the first power supply voltage from the voltage driver circuit to the memory cell array of the semiconductor memory device and blocking the predetermined voltage from the memory array.

Referring to FIG. 8B, the predetermined voltage can be provided from the voltage driver circuit to the memory cell array of the semiconductor memory device and the first power supply voltage can be blocked from the memory array to further increase the increased potential different in the second operation (S830).

Figure 9:
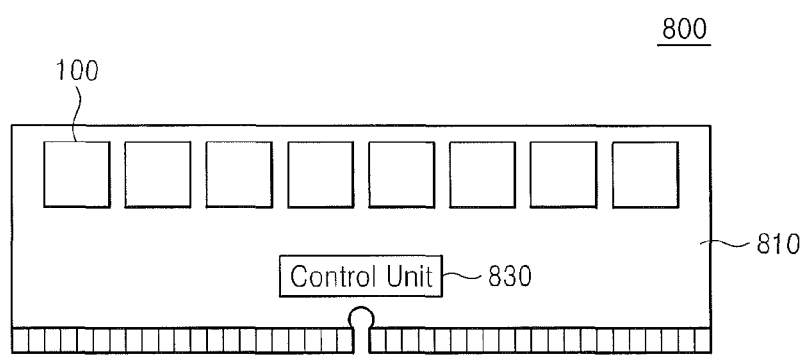
FIG. 9 is a diagram of a memory module including the memory device illustrated in FIG. 1 according to some embodiments of the inventive concept.

FIG. 9 is a diagram of a memory module including the memory device illustrated in FIG. 1. Referring to FIG. 9, the memory module 800 includes a semiconductor substrate 810 and a plurality of semiconductor memory devices 100 mounted on the semiconductor substrate 810. The structure and operation of each of the plurality of semiconductor memory devices 100 are substantially same as those of the semiconductor memory devices 100 as described above.

According to some example embodiments, the memory module 800 may further include a control unit 830 for controlling operation of each semiconductor memory device 100.

The memory module 800 may be implemented by a SIMM (Single In-line Memory Module) or a DIMM (Dual In-line Memory Module).

Figure 10:
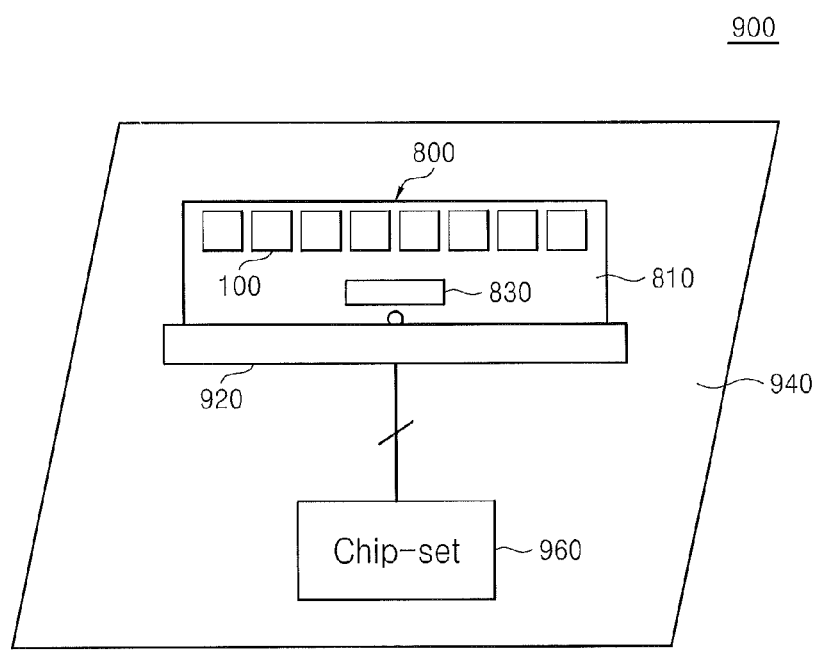
FIG. 10 is a diagram of a memory system including the memory module illustrated in FIG. 9 according to some embodiments of the inventive concept.

FIG. 10 is a diagram of a memory system including the memory module illustrated in FIG. 9 according to some embodiments of the inventive concept.

The memory system 900 may be implemented as a personal computer (PC), a tablet PC, a mobile computing device. The memory system 900 includes a main board 940, a slot 920 mounted on the main board 940, the memory module 800 which may be inserted in the slot 920 and a processor for controlling operation of each of the plurality of semiconductor memory devices 100 which are mounted on the memory module 800 via the slot 920. For example, the processor may be a chip-set 960. The chip-set 960 may transmit and receive data to/from the plurality of semiconductor memory devices 100 through a data bus and the slot 920.

Figure 11:
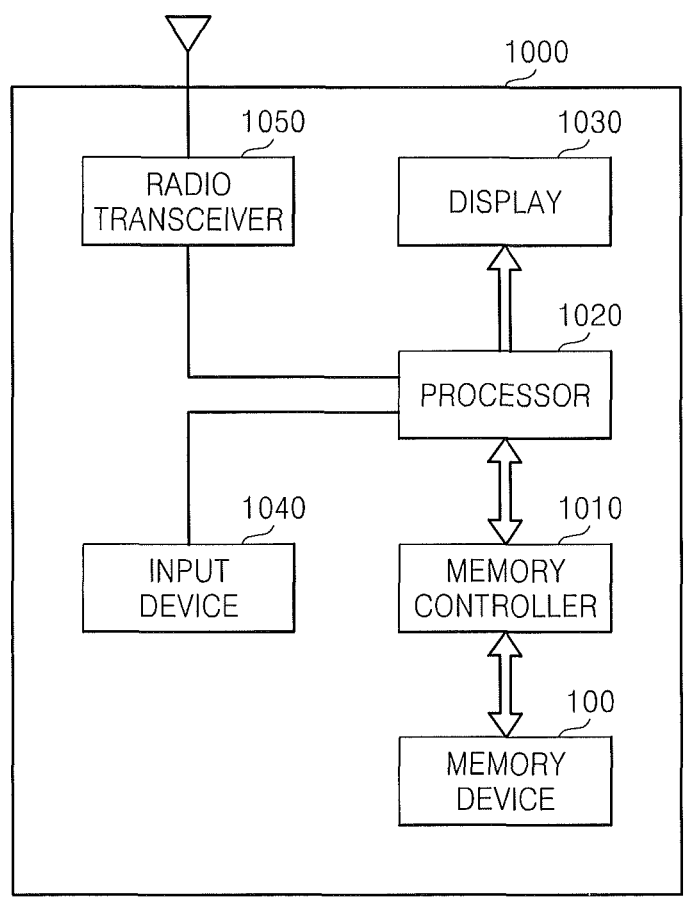
FIG. 11 is a diagram of a memory system including the memory device illustrated in FIG. 1 according to an embodiment of the inventive concept.

FIG. 11 is a diagram of a memory system including the memory device illustrated in FIG. 1 according to an embodiment of the inventive concept.

Referring to FIG. 11, the memory system 1000 may be implemented as a cellular phone, a smart phone, a tablet PC or a wireless internet device. The memory system 1000 includes the semiconductor memory device 100, a processor 1020 controlling a data processing operation of the semiconductor memory device 100 and a memory controller 1010 controlling the data access operations, e.g., a data write operation or data read operation, to the semiconductor memory device 100 according to a control of the processor 1020.

Data stored in the semiconductor memory device 100 may be controlled by the processor 1020 or the memory controller 1010 to be displayed through a display 1030.

The radio transceiver 1050 may transmit or receive a radio signal through an antenna. For example, the radio transceiver 1050 may convert a radio signal received through the antenna into a signal which may be processed by the processor 1020. Accordingly, the processor 1020 may process a signal output from the radio transceiver 1050 and store a processed signal in the semiconductor memory device 100 through the memory controller 1010 or display the processed signal through the display 1030.

Moreover, the radio transceiver 1050 may convert a signal output from the processor 1020 into a radio signal and output a converted radio signal to an external device through the antenna.

An input device 1040 is a device which may input a control signal for controlling an operation of the processor 1020 or data to be processed by the processor 1020. It may be implemented by a pointing device such as a touch pad and a computer mouse, a keypad or a keyboard.

The processor 1020 may control an operation of the display 1030 so that data output from the memory device 100, data output from the radio transceiver 1050, or data output from the input device 1040 may be displayed through the display 1030.

Figure 12:
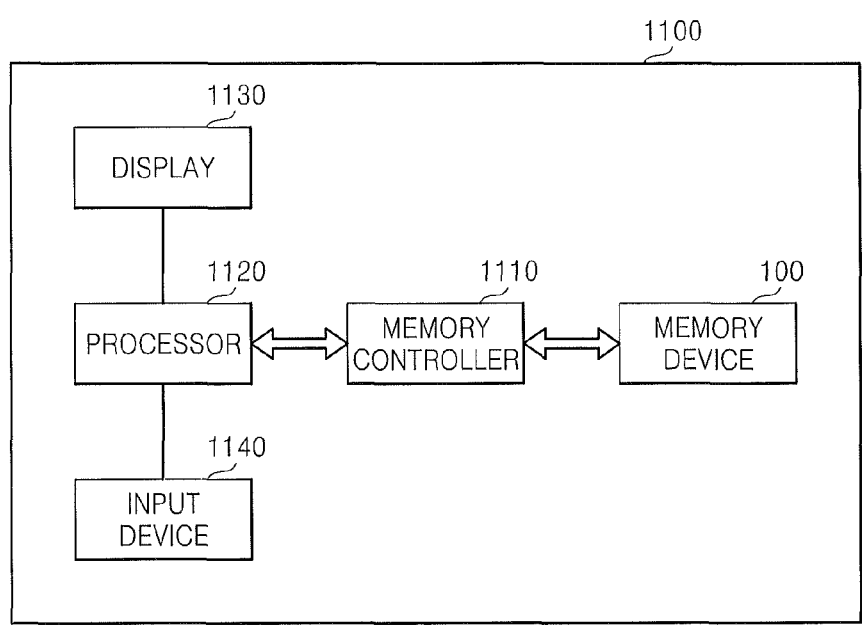
FIG. 12 is a diagram of a memory system including the memory device illustrated in FIG. 1 according to another example embodiment.

FIG. 12 is a diagram of a memory system including the memory device illustrated in FIG. 1 according to another example embodiment. Referring to FIG. 12, the memory system 1100 may be implemented as a data processing device such as a tablet PC, a net-book, an e-reader, a personal digital assistant (PDA), a portable multimedia player (PMP), a MP3 player or a MP4 player. The memory system 1100 includes the semiconductor memory device 100, and a processor 1120 controlling a data processing operation of the semiconductor memory device 100.

The processor 1120 may display data stored in the semiconductor memory device 100 through a display 1130 in response to an input signal generated by an input device 1140.

The memory controller 1110 may control the data access operation of the semiconductor memory device 100 according to a control of the processor 1120.

The input device 1140 may be implemented by a pointing device such as a touch pad or a computer mouse, a keypad or a keyboard.

As described above, according to some embodiments of the inventive concept, a semiconductor memory device increases a sensing margin in a precharge operation, thereby increasing a sensing speed and decreasing data fail.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A semiconductor memory device comprising:
a memory cell array comprising a plurality of word lines, a plurality of bit lines including complementary pairs of bit lines, and a plurality of memory cells storing data;
a sense amplifier coupled to the memory cell array and configured to sense voltage differences between the complementary pairs of bit lines and amplify the voltage differences; and
at least one voltage driver configured to provide either a predetermined voltage or a first power supply voltage to the memory cell array based on a comparison between the predetermined voltage and the first power supply voltage, to increase a sensing margin of the semiconductor memory device,
wherein the semiconductor memory device increases respective potential differences between complementary pairs of bit lines using a voltage isolated wherein the voltage isolated is maintained within the memory cell array after an active wordline becomes inactive in the memory cell array.

2. The semiconductor memory device of claim 1, wherein the at least one voltage driver comprises:
an internal voltage converter connect to the memory cell array via a switch to provide the predetermined voltage; and
a switch controller configured to turn the switch on or off.

3. The semiconductor memory device of claim 2, wherein the at least one voltage driver provides the first power supply voltage to the memory cell array according to a control of the switch controller.

4. The semiconductor memory device of claim 3, wherein the switch controller controls the predetermined voltage not to be provided when the at least one voltage driver provides the first power supply voltage to the memory cell array and controls the first power supply voltage not to be provided to the memory cell array when the at least one voltage driver provides the predetermined voltage to the memory cell array.

5. The semiconductor memory device of claim 3, wherein the switch controller comprises:
an enable block configured to compare a level of the first power supply voltage with a level of the predetermined voltage; and
a control block configured to turn the switch on or off based on an output signal of the enable block.

6. The semiconductor memory device of claim 5, wherein the enable block comprises:

a first N-type metal oxide semiconductor (NMOS) transistor having a source terminal connected to a ground voltage and a gate terminal receiving an enable signal;
a second NMOS transistor having a source terminal connected to a drain terminal of the first NMOS transistor and a gate terminal receiving the first power supply voltage;
a third NMOS transistor having a source terminal connected to the drain terminal of the first NMOS transistor and a gate terminal receiving the predetermined voltage;
a fourth NMOS transistor having a source terminal connected to a drain terminal of the second NMOS transistor;
a fifth NMOS transistor having a source terminal connected to a drain terminal of the third NMOS transistor;
a first P-type metal oxide semiconductor (PMOS) transistor having a source terminal connected to a second power supply voltage, a drain terminal connected to a drain terminal of the fourth NMOS transistor, and a gate terminal connected to a gate terminal of the fourth NMOS transistor and a drain terminal of the fifth NMOS transistor; and
a second PMOS transistor having a source terminal connected to the second power supply voltage, a drain terminal connected to the drain terminal of the fifth NMOS transistor, and a gate terminal connected to a gate terminal of the fifth NMOS transistor and the drain terminal of the fourth NMOS transistor, and
the enable block outputs an output signal through the drain terminal of the fourth or the fifth NMOS transistor based on the first power supply voltage and the predetermined voltage.

7. The semiconductor memory device of claim 6, wherein when the output signal of the enable block is at a logic high level, the control block controls the switch to be turned on.

8. The semiconductor memory device of claim 6, wherein when the output signal of the enable block is at a logic low level, the control block controls the switch to be turned off and the first power supply voltage to be provided to the memory cell array.

9. The semiconductor memory device of claim 3, wherein the internal voltage converter comprises:
a comparator configured to compare a level of the first power supply voltage with a level of a reference voltage; and
a level converting block configured to control a level of the predetermined voltage based on an output signal of the comparator.

10. The semiconductor memory device of claim 9, wherein the comparator comprises:
a sixth N-type metal oxide semiconductor (NMOS) transistor having a source terminal connected to a ground voltage and a gate terminal receiving an enable signal;
a seventh NMOS transistor having a source terminal connected to a drain terminal of the sixth NMOS transistor and a gate terminal receiving the first power supply voltage;
an eighth NMOS transistor having a source terminal connected to the drain terminal of the sixth NMOS transistor and a gate terminal receiving the reference voltage;
a ninth NMOS transistor having a source terminal connected to a drain terminal of the seventh NMOS transistor;
a tenth NMOS transistor having a source terminal connected to a drain terminal of the eighth NMOS transistor;

a third P-type metal oxide semiconductor (PMOS) transistor having a source terminal connected to a second power supply voltage, a drain terminal connected to a drain terminal of the ninth NMOS transistor, and a gate terminal connected to a gate terminal of the ninth NMOS transistor and a drain terminal of the tenth NMOS transistor; and a fourth PMOS transistor having a source terminal connected to the second power supply voltage, a drain terminal connected to the drain terminal of the tenth NMOS transistor, and a gate terminal connected to a gate terminal of the tenth NMOS transistor and the drain terminal of the ninth NMOS transistor, and the comparator outputs an output signal through the drain terminal of the ninth or the tenth NMOS transistor based on the first power supply voltage and the reference voltage.

11. The semiconductor memory device of claim 10, wherein the level converting block comprises:

an eleventh NMOS transistor having a source terminal connected to the ground voltage and a gate terminal receiving the output signal of the comparator;

a twelfth NMOS transistor having a source terminal connected to a drain terminal of the eleventh NMOS transistor and a gate terminal receiving the predetermined voltage to be provided to the memory cell array;

a thirteenth NMOS transistor having a source terminal connected to the drain terminal of the eleventh NMOS transistor and a gate terminal receiving a control voltage for adjusting the predetermined voltage to be provided to the memory cell array;

a fifth PMOS transistor having a source terminal connected to the second power supply voltage and having a gate terminal and drain terminal that are connected in common to each other and to a drain terminal of the twelfth NMOS transistor;

a sixth PMOS transistor having a source terminal connected to the second power supply voltage, a gate terminal connected to the gate terminal of the fifth PMOS transistor, and a drain terminal connected to a drain terminal of the thirteenth NMOS transistor;

a seventh PMOS transistor having a source terminal connected to the second power supply voltage and a gate terminal connected to the drain terminal of the thirteenth NMOS transistor; and a voltage source configured to be connected to a drain terminal of the seventh PMOS transistor and to apply the predetermined voltage to be provided to the memory cell array to the gate terminal of the twelfth NMOS transistor, and the level converting block adjusts the level of the predetermined voltage to be provided to the memory cell array using a level of the control voltage based on the output signal of the comparator.

12. The semiconductor memory device of claim 11, wherein when the output signal of the comparator is at a logic high level, the level converting block adjusts the level of the predetermined voltage.

13. A method of operating a semiconductor memory device, the method comprising:

(a) comparing a level of a first power supply voltage with a level of a predetermined voltage provided to a memory cell array to provide a comparison result;

(b) providing the first power supply voltage or the predetermined voltage to the memory cell array based on the comparison result so as to increase a sensing margin of the semiconductor memory device; and (c) increasing a potential difference between a bit line and a complementary bit line as sensing is carried out by a sense amplifier, wherein when operations (a) through (c) are repeated, operation (c) comprises increasing the potential difference between the bit line and the complementary bit line using a voltage isolated in the memory cell array.

14. The method of claim 13, wherein operation (b) comprises providing the first power supply voltage to the memory cell array when the level of the first power supply voltage is greater than the level of the predetermined voltage.

15. The method of claim 13, wherein operation (b) comprises providing the predetermined voltage to the memory cell array when the level of the predetermined voltage is greater than the level of the first power supply voltage.

16. A method of operating a semiconductor memory device, the method comprising:

(a) providing a first power supply voltage from a voltage driver circuit to a memory cell array of the semiconductor memory device;

(b) turning on a selected word line;

(c) sensing a potential difference between voltages on a bit line and an associated complementary bit line;

(d) blocking the first power supply voltage from the memory array and providing a predetermined voltage from the voltage driver circuit to the memory cell array;

(e) turning off the selected word line;

(f) maintaining an isolated voltage within the memory array;

(g) blocking the first power supply voltage and the predetermined voltage from the memory array;

(h) turning on the selected word line; and (i) sensing the potential difference between voltages on the bit line and the associated complementary bit line using the isolated voltage maintained within the memory array.

17. The method of claim 16, wherein (a)~(e) are performed in a first operation of the memory device and (f)~(i) are performed in a second operation of the memory device following the first operation.

18. The method of claim 16, wherein the potential difference sensed in operation (i) is increased compared to the potential difference sensed in (c).

19. The method of claim 16, further comprising:

(j) providing the first power supply voltage from the voltage driver circuit to the memory cell array of the semiconductor memory device and blocking the predetermined voltage from the memory array.

20. The method of claim 19, wherein (d)~(e) are repeated after (j) is performed.

* * * * *